US012665133B2

(12) United States Patent
Onishi

(10) Patent No.: US 12,665,133 B2
(45) Date of Patent: Jun. 23, 2026

(54) CERAMIC ELECTRONIC COMPONENT WITH CARRIER SUBSTRATE, MOUNTING STRUCTURE OF CERAMIC ELECTRONIC COMPONENT, AND ELECTRONIC COMPONENT ARRAY

(71) Applicant: Murata Manufacturing Co., Ltd., Nagaokakyo (JP)

(72) Inventor: Kosuke Onishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 237 days.

(21) Appl. No.: 18/093,353

(22) Filed: Jan. 5, 2023

(65) Prior Publication Data

US 2023/0245829 A1 Aug. 3, 2023

(30) Foreign Application Priority Data

Feb. 1, 2022 (JP) ................................. 2022-014555

(51) Int. Cl.
| | |
|---|---|
| *H01G 4/30* | (2006.01) |
| *H01G 4/12* | (2006.01) |
| *H01G 4/228* | (2006.01) |
| *H05K 1/181* | (2026.01) |

(52) U.S. Cl.
CPC ................. *H01G 4/30* (2013.01); *H01G 4/12* (2013.01); *H01G 4/228* (2013.01); *H05K 1/181* (2013.01); *H05K 2201/10015* (2013.01)

(58) Field of Classification Search
CPC ............ H01G 4/30; H01G 4/12; H01G 4/228; H01G 2/02; H01G 2/06; H01G 4/232; H01G 2/065; H01G 4/002; H01G 4/38; H05K 1/181; H05K 2201/10015

USPC .......................................................... 174/260
See application file for complete search history.

(56) References Cited

U.S. PATENT DOCUMENTS

| | | | | | |
|---|---|---|---|---|---|
| 4,873,397 A | * | 10/1989 | Masujima | .............. | H05K 3/306 174/117 A |
| 8,988,850 B1 | * | 3/2015 | Kodama | ................ | H01G 4/232 361/301.4 |
| 2010/0146778 A1 | * | 6/2010 | Dooka | ................. | H01G 13/006 29/832 |

(Continued)

FOREIGN PATENT DOCUMENTS

| | | |
|---|---|---|
| JP | S631318 U | 1/1988 |
| JP | S63112367 U | 7/1988 |

(Continued)

OTHER PUBLICATIONS

Machine translation of Hiroshi (JP S63-1318U, the priro art submitted by the applicant.*

(Continued)

*Primary Examiner* — Timothy J Thompson
(74) *Attorney, Agent, or Firm* — Keating & Bennett, LLP

(57) ABSTRACT

A ceramic electronic component with a carrier substrate includes a ceramic electronic component including first and second principal surfaces, first and second end surfaces, first and second side surfaces, and at least two external electrodes on an outer surface of the ceramic electronic component, and a carrier substrate attached to the second principal surface of the ceramic electronic component, wherein a first adhesive layer is on the first principal surface of the ceramic electronic component.

10 Claims, 10 Drawing Sheets

(56)        References Cited

U.S. PATENT DOCUMENTS

| | | | |
|---|---|---|---|
| 2016/0044794 A1* | 2/2016 | Stahr | H01L 24/82 |
| | | | 29/837 |
| 2018/0339945 A1 | 11/2018 | Baba | |
| 2020/0035417 A1* | 1/2020 | Sakurai | H01G 4/258 |
| 2020/0084893 A1* | 3/2020 | Epmeier | H05K 3/3478 |
| 2021/0304963 A1 | 9/2021 | Ishihara et al. | |

FOREIGN PATENT DOCUMENTS

| | | | |
|---|---|---|---|
| JP | H01220801 | A | 9/1989 |
| JP | 2-153514 | A | 6/1990 |
| JP | H0576074 | U | 10/1993 |
| JP | H1154367 | A | 2/1999 |
| JP | 2000-100647 | A | 4/2000 |
| JP | 2001223455 | A | 8/2001 |
| JP | 2005340585 | A | 12/2005 |
| JP | 2018-199598 | A | 12/2018 |
| WO | 2021/152934 | A1 | 8/2021 |

OTHER PUBLICATIONS

Office Action in JP2022-014555, mailed Apr. 23, 2024, 8 pages.
Office Action in JP2022-014555, mailed Jan. 30, 2024, 7 pages.

* cited by examiner

300

300

CERAMIC ELECTRONIC COMPONENT WITH CARRIER SUBSTRATE, MOUNTING STRUCTURE OF CERAMIC ELECTRONIC COMPONENT, AND ELECTRONIC COMPONENT ARRAY

CROSS REFERENCE TO RELATED APPLICATIONS

This application claims the benefit of priority to Japanese Patent Application No. 2022-014555 filed on Feb. 1, 2022. The entire contents of this application are hereby incorporated herein by reference.

BACKGROUND OF THE INVENTION

1. Field of the Invention

The present invention relates to a ceramic electronic component with a carrier substrate, a ceramic electronic component with a carrier substrate attached to the ceramic electronic component, a mounting structure of a ceramic electronic component, and an electronic component array.

2. Description of the Related Art

Ceramic electronic components, such as multilayer ceramic capacitors, are widely used in electronic devices, and various devices including electronic devices (hereinafter referred to as "electronic device and the like"). For example, Japanese Patent Laid-open No. 2000-100647 discloses a multilayer ceramic capacitor having a typical structure.

Downsizing of the electronic device and the like and enhancement of functionality of the electronic device and the like have rapidly advanced. The downsizing of the electronic device and the like makes an internal space (space size) of the electronic device and the like for storing an electronic circuit defined by electronic components extremely small. Further, the number of electronic components required for an electronic circuit has rapidly increased due to the enhancement of functionality of the electronic device and the like.

The downsizing of the electronic device and the like and the enhancement of functionality of the electronic device and the like therefore require electronic components of an electronic circuit to be downsized. For example, for a multilayer ceramic capacitor, an extremely thin product in which a ceramic body has a thickness of several tens of μm has been put into practical use.

As described above, the downsizing of the electronic device and the like and the enhancement of functionality of the electronic device and the like require the electronic components to be downsized, particularly, a decrease in the thickness of the electronic components, but, for ceramic electronic components, such a decrease in thickness causes a reduction in mechanical strength against an external force.

That is, in general, a surface-mounting ceramic electronic component is provided at a predetermined position such as a board with the surface-mounting ceramic electronic component attracted by a nozzle of a mounter device and mounted on the board. At this time, the ceramic electronic component that has been made thinner may suffer a crack in a ceramic body due to an impact from the nozzle. Then, the generation of a crack in the ceramic body may make insulation resistance (IR) of the ceramic electronic component poor due to intrusion of moisture or the like from the outside.

Further, in some cases, the thickness of the ceramic body is made greater than or equal to a certain thickness in order to maintain the mechanical strength against the external force although the ceramic body can be made thinner in terms of manufacturing technology and product characteristics.

SUMMARY OF THE INVENTION

Preferred embodiments of the present invention provide ceramic electronic components each with a carrier substrate that is less susceptible to a crack or the like in a ceramic body of the ceramic electronic component when the ceramic electronic component is attracted by, for example, a nozzle of a mounter device.

A ceramic electronic component with a carrier substrate according to a preferred embodiment of the present invention includes a ceramic electronic component including a first principal surface and a second principal surface, a first end surface and a second end surface, and a first side surface and a second side surface, and at least two external electrodes on an outer surface of the ceramic electronic component, and a carrier substrate attached to the second principal surface of the ceramic electronic component, wherein a first adhesive layer is on the first principal surface of the ceramic electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
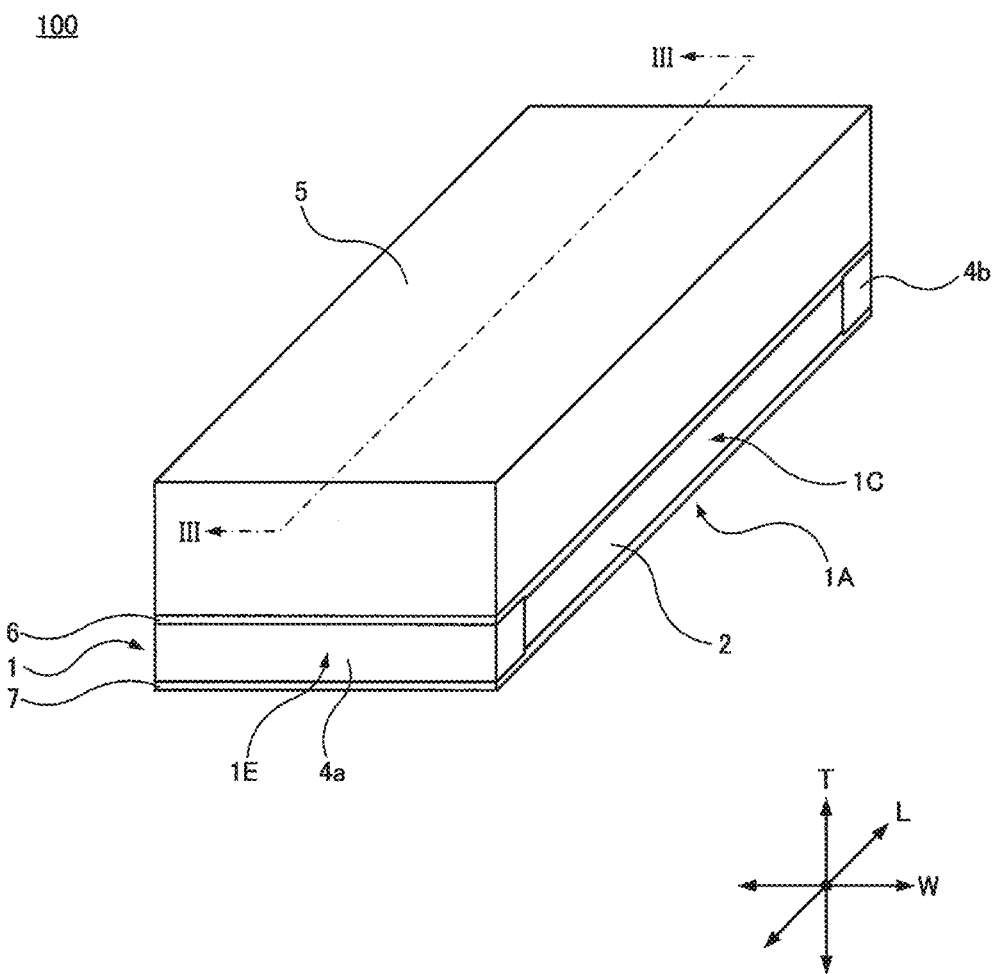
FIG. 1 is a perspective view of a ceramic electronic component 100 with a carrier substrate according to a preferred embodiment of the present invention.

Hereinafter, preferred embodiments of the present invention will be described with reference to the drawings.

Although each preferred embodiment will be described by way of illustration and example only, the present invention is not limited by the terms of the preferred embodiments. Further, it is possible to combine elements described in different preferred embodiments and implement the combination, and such a combination also falls within the scope of the present invention. Further, the drawings are provided to facilitate understanding hereof. Some of the drawings are schematically drawn, and dimensional ratios of drawn components or dimensional ratios between the components may not match dimensional ratios described herein. Further, the components described herein may be omitted in the drawings, or the number of components may be reduced.

First Preferred Embodiment

Ceramic Electronic Component Including Carrier Substrate

Figure 2:
FIG. 2 is an exploded perspective view of ceramic electronic component 100 including the carrier substrate.
Figure 3:
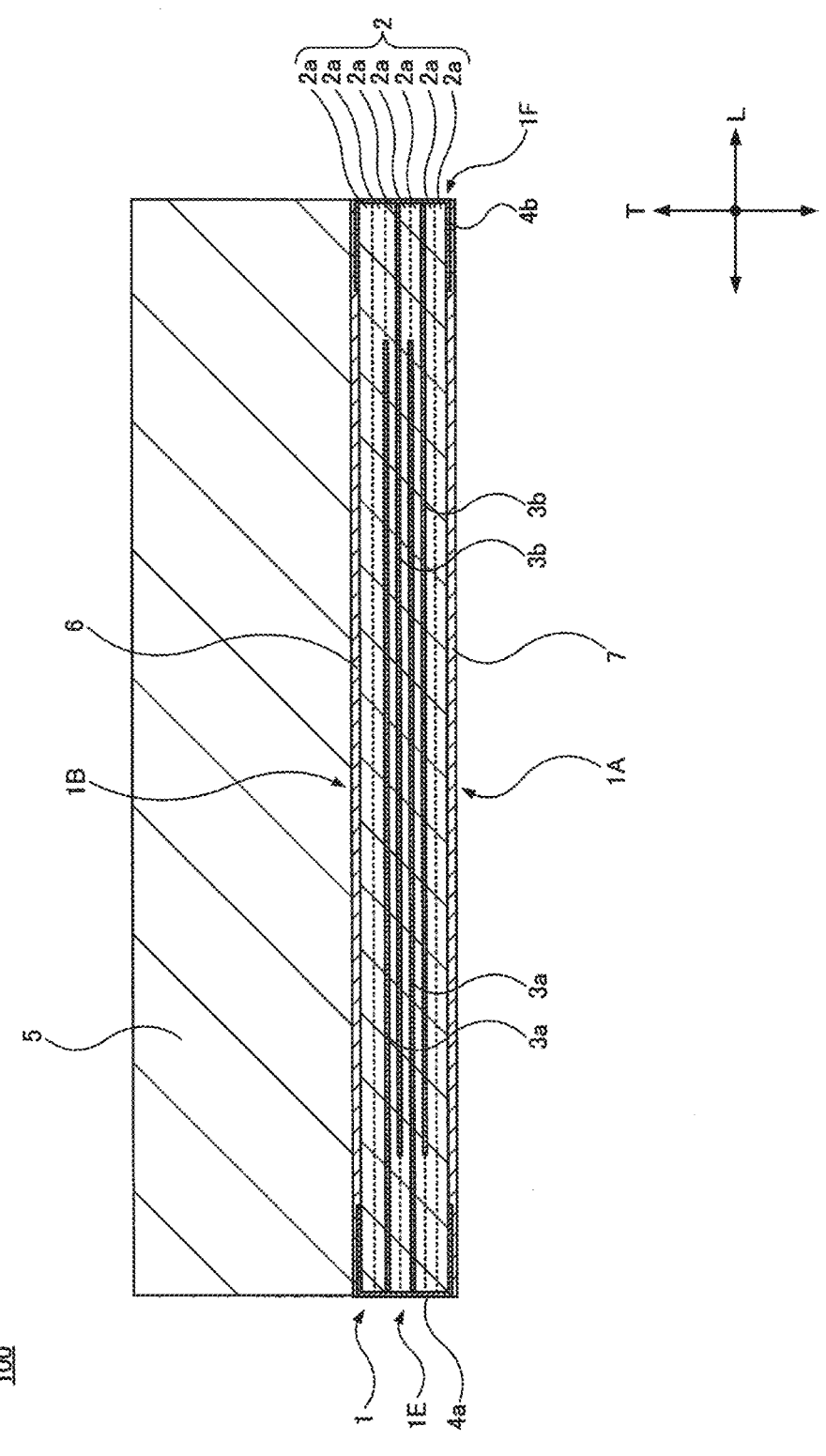
FIG. 3 is a cross-sectional view of ceramic electronic component 100 including the carrier substrate.

FIGS. 1 to 3 each illustrate a ceramic electronic component 100 with a carrier substrate according to a first preferred embodiment of the present invention. FIG. 1 is a perspective view of ceramic electronic component 100 with a carrier substrate. FIG. 2 is an exploded perspective view of ceramic electronic component 100 with a carrier substrate. FIG. 3 is a cross-sectional view of ceramic electronic component 100 with a carrier substrate, illustrating a portion indicated by a long dashed short dashed arrow in FIG. 1. As illustrated in FIGS. 1 and 2, ceramic electronic component 100 with a carrier substrate has a height direction T, a width direction W, and a length direction L.

According to the present preferred embodiment, ceramic electronic component 100 with a carrier substrate includes, for example, a multilayer ceramic capacitor 1 as a ceramic electronic component. Ceramic electronic components according to preferred embodiments of the present invention, however, are of any type, and are not limited to the multilayer ceramic capacitor. For example, the ceramic electronic component may be an inductor, a thermistor, a varistor, a resistor, or the like other than a capacitor. Further, the ceramic electronic component is not limited to a multilayer ceramic electronic component, and may be, for example, a bulk ceramic electronic component.

Multilayer ceramic capacitor 1 includes a first principal surface (lower principal surface in the drawing) 1A and a second principal surface (upper principal surface in the drawing) 1B on an opposite side from first principal surface 1A in height direction T. Multilayer ceramic capacitor 1 further includes a first side surface 1C and a second side surface 1D on an opposite side from first side surface 1C in width direction W. Multilayer ceramic capacitor 1 further includes a first end surface 1E and a second end surface 1F on an opposite side from first end surface 1E in length direction L.

Multilayer ceramic capacitor 1 has any size, and, according to the present preferred embodiment, multilayer ceramic capacitor 1 has, for example, a height of about 100 $\mu$m, a width of about 300 $\mu$m, and a length of about 600 $\mu$m.

Multilayer ceramic capacitor 1 includes a ceramic body 2. As illustrated in FIG. 3, ceramic body 2 includes a laminate of a plurality of ceramic layers 2a. The number of ceramic layers 2a may be freely determined.

Ceramic body 2 (ceramic layers 2a) is made of any material, and, for example, dielectric ceramics primarily including $BaTiO_3$ may be used. Dielectric ceramics primarily including a material other than $BaTiO_3$ such as, for example, $CaTiO_3$, $SrTiO_3$, or $CaZrO_3$ may be used.

Internal electrodes 3a, 3b are provided between ceramic layers 2a. The number of layers and the thickness of internal electrodes 3a, 3b may be freely determined. In principle, however, internal electrodes 3a, 3b are alternately arranged in height direction T. No internal electrodes 3a, 3b are provided between some of ceramic layers 2a.

Internal electrode 3a is extended to first end surface 1E of multilayer ceramic capacitor 1. Internal electrode 3b is extended to second end surface 1F of multilayer ceramic capacitor 1.

Internal electrodes 3a, 3b is primarily made of any material, and, according to the present preferred embodiment, for example, Ni is used. Rather than Ni, another metal such as, for example, Cu, Ag, Pd, or Au may be used. Further, Ni, Cu, Ag, Pd, or Au may be an alloy including another metal.

An external electrode 4a is provided on first end surface 1E of multilayer ceramic capacitor 1. External electrode 4a has a cap shape, and includes edge portions extending from first end surface 1E to first principal surface 1A, second principal surface 1B, first side surface 1C, and second side surface 1D. An external electrode 4b is provided on second end surface 1F of multilayer ceramic capacitor 1. External electrode 4b has a cap shape, and includes edge portions extending from second end surface 1F to first principal surface 1A, second principal surface 1B, first side surface 1C, and second side surface 1D.

Internal electrode 3a is connected to external electrode 4a. Internal electrode 3b is connected to external electrode 4b.

According to the present preferred embodiment, external electrodes 4a, 4b have a multilayer structure. FIG. 3, however, illustrates external electrodes 4a, 4b as one layer with visibility taken into account. According to the present preferred embodiment, external electrodes 4a, 4b include, for example, a first layer provided by baking a conductive paste primarily including Ni, a second layer that is a plating layer primarily including Cu, a third layer that is a plating layer primarily including Ni, and a fourth layer that is a plating layer primarily including Sn. The structure of external electrodes 4a, 4b and the material of each layer may be freely determined and changed.

Ceramic electronic component 100 with a carrier substrate includes a carrier substrate 5. Carrier substrate 5 is made of any material, and, according to the present preferred embodiment, for example, resin is used. Carrier substrate 5 also has any size, and, according to the present preferred embodiment, carrier substrate 5 has, for example, a height of about 200 $\mu$m, a width of about 300 $\mu$m, and a length of about 600 $\mu$m. Carrier substrate 5 may also have any surface roughness, and the surface roughness may be set as desired. Carrier substrate 5 is made by, for example, resin molding, but the surface roughness may be adjusted by, for example, barrel polishing, sandblasting, or the like after manufacturing.

Carrier substrate 5 is attached to second principal surface 1B of multilayer ceramic capacitor 1 with a second adhesive layer 6 interposed between carrier substrate 5 and second principal surface 1B. Second adhesive layer 6 is made of any material, and, for example, the same material as an adhesive layer of a sticky note with an adhesive layer commercially available as stationery may be used. Second adhesive layer 6 may also have any thickness. Note that, according to the present preferred embodiment, second adhesive layer 6 is provided over the entire or substantially the entire second principal surface 1B of multilayer ceramic capacitor 1 and the lower surface of carrier substrate 5, but may be partially provided. This allows a reduction in adhesive force between multilayer ceramic capacitor 1 and carrier substrate 5. Here, the adhesive force refers to a force required to separate multilayer ceramic capacitor 1 and carrier substrate 5 when the force is applied in a direction to cause multilayer ceramic capacitor 1 and carrier substrate 5 to separate from each other.

Carrier substrate 5 is provided, for example, to reduce a possibility of the occurrence of a defect such as a crack in ceramic body 2 of multilayer ceramic capacitor 1 (ceramic electronic component) when ceramic electronic component 100 with a carrier substrate is attracted by a nozzle or the like of a mounter device. Therefore, when ceramic electronic component 100 with a carrier substrate is attracted by the nozzle or the like of the mounter device, the upper surface of carrier substrate 5 is attracted. Carrier substrate 5 becomes unnecessary after multilayer ceramic capacitor 1 (ceramic electronic component) is mounted on a board or the like, such that carrier substrate 5 is removed and discarded after mounting.

According to the present preferred embodiment, multilayer ceramic capacitor 1 and carrier substrate 5 are identical or substantially identical in size and shape to each other, that is, for example, are both rectangular or substantially rectangular with a width of about 300 μm and a length of about 600 μm as viewed from above. The sizes and shapes as viewed from above, however, are not necessarily the same, and carrier substrate 5 may be smaller than multilayer ceramic capacitor 1 or may be larger than multilayer ceramic capacitor 1.

A first adhesive layer 7 is provided on first principal surface 1A of multilayer ceramic capacitor 1. First adhesive layer 7 is made of any material, and, for example, the same material as second adhesive layer 6 may be used. First adhesive layer 7 also has any thickness.

When multilayer ceramic capacitor 1 (ceramic electronic component) is mounted on a board or the like, first adhesive layer 7 is used for temporarily attaching multilayer ceramic capacitor 1 to the board or the like. That is, bonding external electrodes 4a, 4b to a mounting electrode of the board or the like with, for example, reflow solder causes multilayer ceramic capacitor 1 to be mounted on the board or the like, but first adhesive layer 7 can be used for temporary attachment before reflow soldering.

According to the present preferred embodiment, first adhesive layer 7 is provided on the entire or substantially the entire first principal surface 1A of multilayer ceramic capacitor 1. First adhesive layer 7 may be partially provided on first principal surface 1A of multilayer ceramic capacitor 1. For example, first adhesive layer 7 may be provided only on a portion of first principal surface 1A of multilayer ceramic capacitor 1 where external electrodes 4a, 4b are not provided. This makes it possible to prevent first adhesive layer 7 from interfering with bonding between external electrodes 4a, 4b and the mounting electrode of the board or the like.

In ceramic electronic component 100 with a carrier substrate, the adhesive force between multilayer ceramic capacitor 1 (ceramic electronic component) and carrier substrate 5 is preferably smaller than an adhesive force applied when multilayer ceramic capacitor 1 is temporarily attached to the board or the like. This is because pulling carrier substrate 5 upward after multilayer ceramic capacitor 1 is temporarily attached to the board or the like allows carrier substrate 5 to be easily removed from multilayer ceramic capacitor 1 with the temporary attachment maintained. For this purpose, for example, first adhesive layer 7 and second adhesive layer 6 are made of different materials to make first adhesive layer 7 larger in adhesive force than second adhesive layer 6. Alternatively, first adhesive layer 7 and second adhesive layer 6 may be made of the same material, but first adhesive layer 7 needs to be made larger in area than second adhesive layer 6.

In order to compare the adhesive force of first adhesive layer 7 and the adhesive force of second adhesive layer 6 in ceramic electronic component 100 with a carrier substrate, the following experiment was conducted. In this experiment, first adhesive layer 7 and second adhesive layer 6 were made of different materials. First, a test substrate (not illustrated) was made of the same material as carrier substrate 5. The test substrate had an attachment surface with the same or substantially the same surface roughness as carrier substrate 5. Next, first principal surface 1A of multilayer ceramic capacitor 1 was attached to the attachment surface of the test substrate with first adhesive layer 7 interposed between first principal surface 1A and the attachment surface. Next, a force was applied to the test substrate and carrier substrate 5 in a direction to cause the test substrate and carrier substrate 5 to separate from each other. The applied force was gradually increased. As a result, multilayer ceramic capacitor 1 and carrier substrate 5 separated from each other earlier than multilayer ceramic capacitor 1 and the test substrate. From the above experiment, it was confirmed that first adhesive layer 7 had a larger adhesive force than second adhesive layer 6.

When ceramic electronic component 100 with a carrier substrate is attracted by, for example, a nozzle of a mounter device, carrier substrate 5 can be used as an attraction portion, thus making ceramic electronic component 100 with a carrier substrate less susceptible to a crack or the like in ceramic body 2 of multilayer ceramic capacitor 1 (ceramic electronic component).

When ceramic electronic component 100 with a carrier substrate is mounted on a board or the like, first adhesive layer 7 can be used for temporary attachment.

According to the present preferred embodiment, carrier substrate 5 is made of, for example, resin. As described above, carrier substrate 5 is made of any material, and a material other than resin such as, for example, ceramics may be used. Further, in a case where carrier substrate 5 is made of ceramics, carrier substrate 5 may include a single layer or a laminate including a plurality of ceramic layers. Further, in a case where carrier substrate 5 includes a laminate including a plurality of ceramic layers, a dummy electrode may be provided between the ceramic layers. Further, in a case where carrier substrate 5 includes a laminate of a plurality of ceramic layers, and a dummy electrode is provided between the ceramic layers, the dummy electrode may or need not be exposed to the outside of carrier substrate 5.

Example of Method for Manufacturing Ceramic Electronic Component with Carrier Substrate Ceramic electronic component 100 with a carrier substrate can be manufactured, for example, by the method illustrated in FIGS. 4A to 4F and 5A to 5F.

Figure 4A:
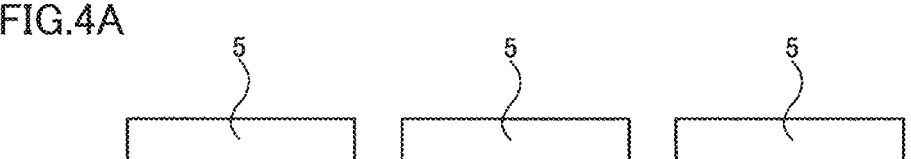
FIGS. 4A to 4F are diagrams for describing respective processes of an example of a method for manufacturing ceramic electronic component 100 with a carrier substrate.

First, as illustrated in FIG. 4A, a plurality of carrier substrates 5 are prepared.

Figure 4B:
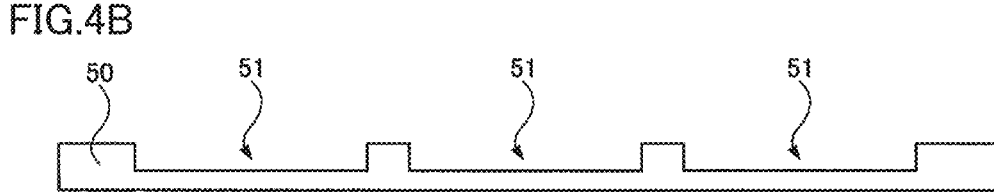

Next, as illustrated in FIG. 4B, a first jig 50 is prepared. First jig 50 is made of, for example, a flat metal plate, and a plurality of first storage portions 51 having a hollow shape are provided in one principal surface. Although not illustrated, a vacuum attraction hole is provided in a bottom surface of each first storage portion 51 of first jig 50, and when a storage object is vacuum-attracted, the storage object does not fall even if a surface of first jig 50 where no first storage portion 51 is provided faces downward.

Figure 4C:
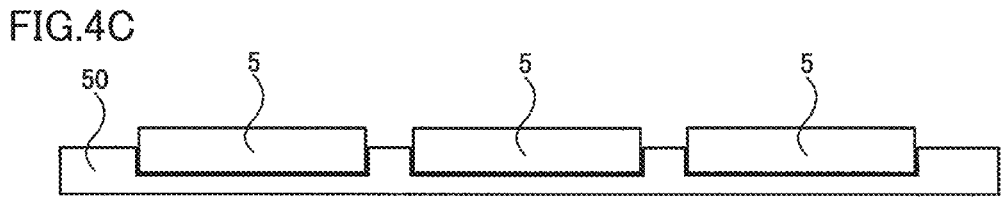

Next, as illustrated in FIG. 4C, carrier substrate 5 is stored in each first storage portion 51 of first jig 50. For storage, for example, a method by which with a plurality of carrier substrates 5 placed on the surface of first jig 50 where first storage portions 51 are provided, first jig 50 is vibrated so as to cause carrier substrates 5 to fall into first storage portions 51 may be employed. After carrier substrates 5 are stored in first storage portions 51, carrier substrates 5 are each attracted by the vacuum attraction hole.

Figure 4D:
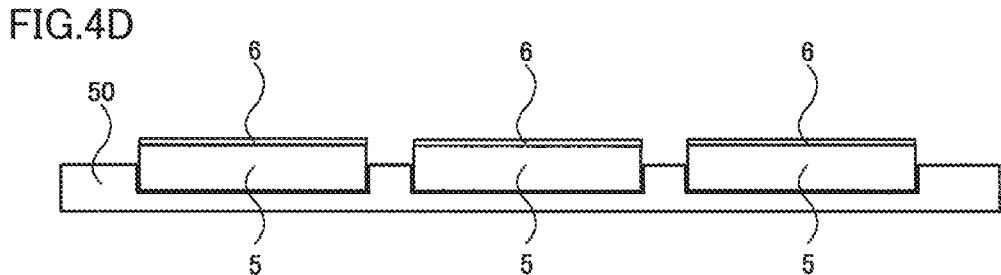

Next, as illustrated in FIG. 4D, second adhesive layer 6 is provided on a surface of each carrier substrate 5 that is exposed from first storage portion 51 of first jig 50. Second adhesive layer 6 is provided by any method, and may be provided by, for example, screen printing or inkjet printing.

Figure 4E:
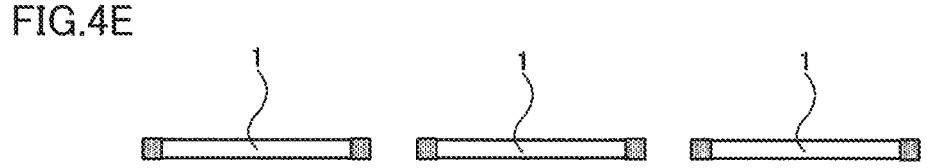

Next, as illustrated in FIG. 4E, a plurality of multilayer ceramic capacitors 1 (ceramic electronic components) are prepared.

Figure 4F:
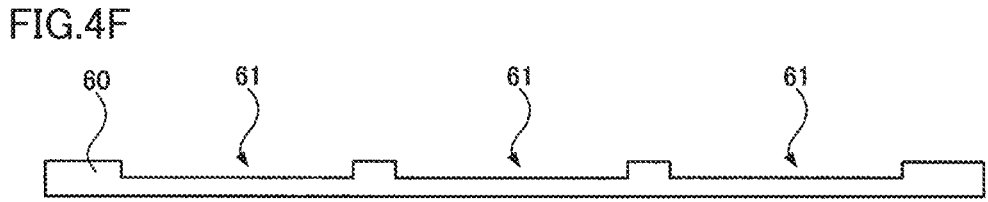

Next, as illustrated in FIG. 4F, a second jig 60 is prepared. As with first jig 50, second jig 60 is made of, for example, a flat metal plate, and a plurality of second storage portions 61 having a hollow shape are provided in one principal surface. Although not illustrated, a vacuum attraction hole is provided in a bottom surface of each second storage portion 61 of second jig 60, and when a storage object is vacuum-attracted, the storage object does not fall even if a surface of second jig 60 where no second storage portion 61 is provided faces downward. According to the present preferred embodiment, second storage portion 61 is smaller in depth than first storage portion 51.

Figures 5A, 5B, 5C, 5D, 5E, 5F:
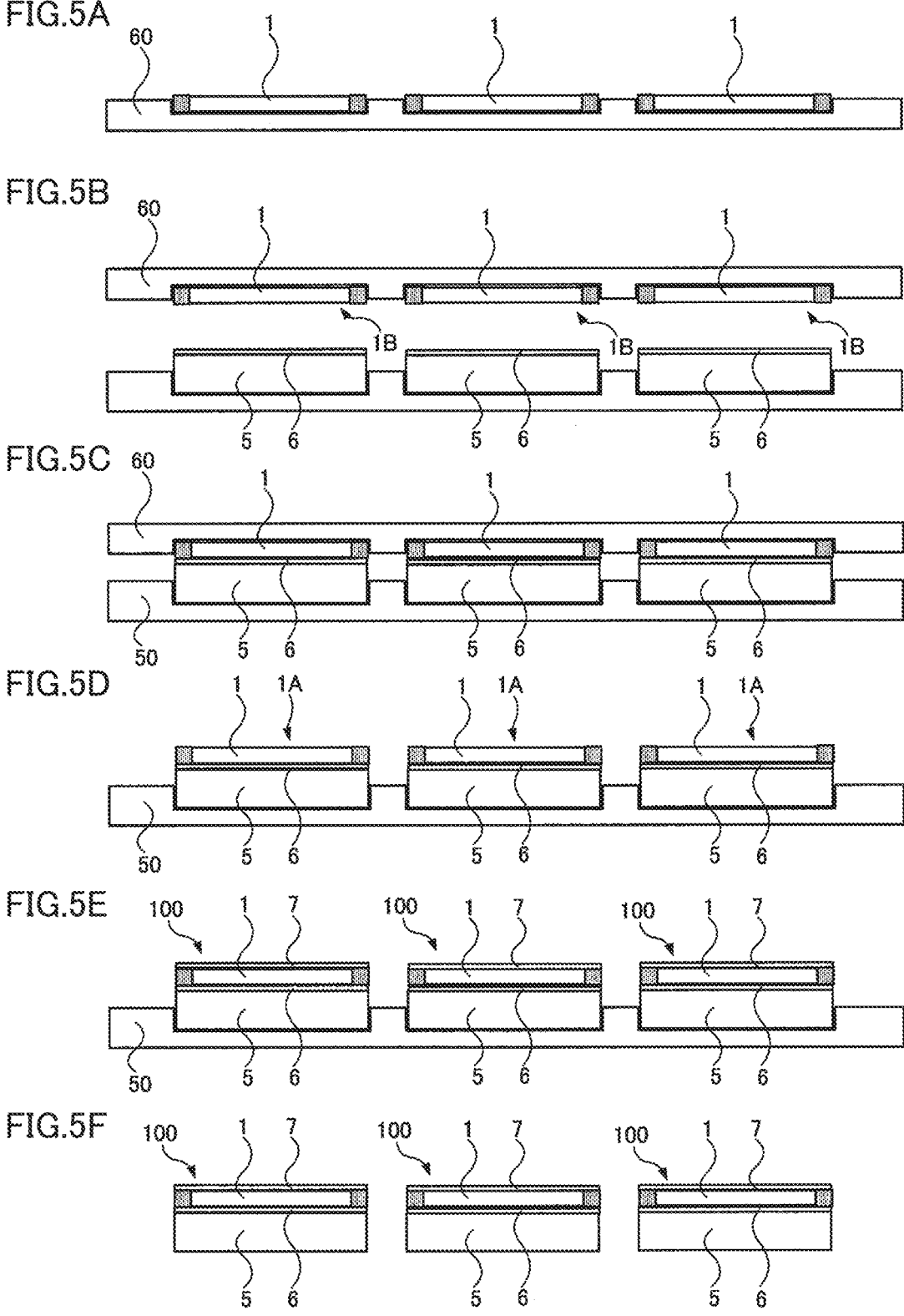
FIGS. 5A to 5F are continuations of FIG. 4F and are diagrams for describing respective processes of the example of the method for manufacturing ceramic electronic component 100 with a carrier substrate.

Next, as illustrated in FIG. 5A, multilayer ceramic capacitor 1 is stored in each second storage portion 61 of second jig 60. For the storage, for example, a method by which with a plurality of multilayer ceramic capacitors 1 placed on the surface of second jig 60 where second storage portions 61 are provided, second jig 60 is vibrated so as to cause multilayer ceramic capacitors 1 to fall into second storage portions 61 may be used. After multilayer ceramic capacitors 1 are stored in second storage portions 61, multilayer ceramic capacitors 1 are each attracted by the vacuum attraction hole.

Next, as illustrated in FIG. 5B, second jig 60 in which multilayer ceramic capacitors 1 have been stored is placed over first jig 50 in which carrier substrates 5 each including second adhesive layer 6 provided thereon have been stored with second principal surfaces 1B of multilayer ceramic capacitors 1 facing downward.

Next, as illustrated in FIG. 5C, second jig 60 is lowered toward first jig 50 to bond second adhesive layers 6 of carrier substrates 5 to second principal surfaces 1B of multilayer ceramic capacitors 1.

Next, after the attraction of multilayer ceramic capacitors 1 by the vacuum attraction holes in second storage portions 61 is stopped, second jig 60 is raised in a direction away from first jig 50. As a result, as illustrated in FIG. 5D, multilayer ceramic capacitors 1 to which carrier substrates 5 have been attached remains on first jig 50. Multilayer ceramic capacitors 1 each include first principal surface 1A exposed to the outside (upper side).

Next, as illustrated in FIG. 5E, first adhesive layer 7 is provided on first principal surface 1A of each multilayer ceramic capacitor 1. First adhesive layer 7 is provided by any method, and may be provided by, for example, the same or substantially the same method as second adhesive layer 6. As a result, ceramic electronic component 100 with a carrier substrate is completed.

Finally, as illustrated in FIG. 5F, ceramic electronic components 100 with a carrier substrate is removed from first jig 50.

Electronic Component Array

Figure 6:
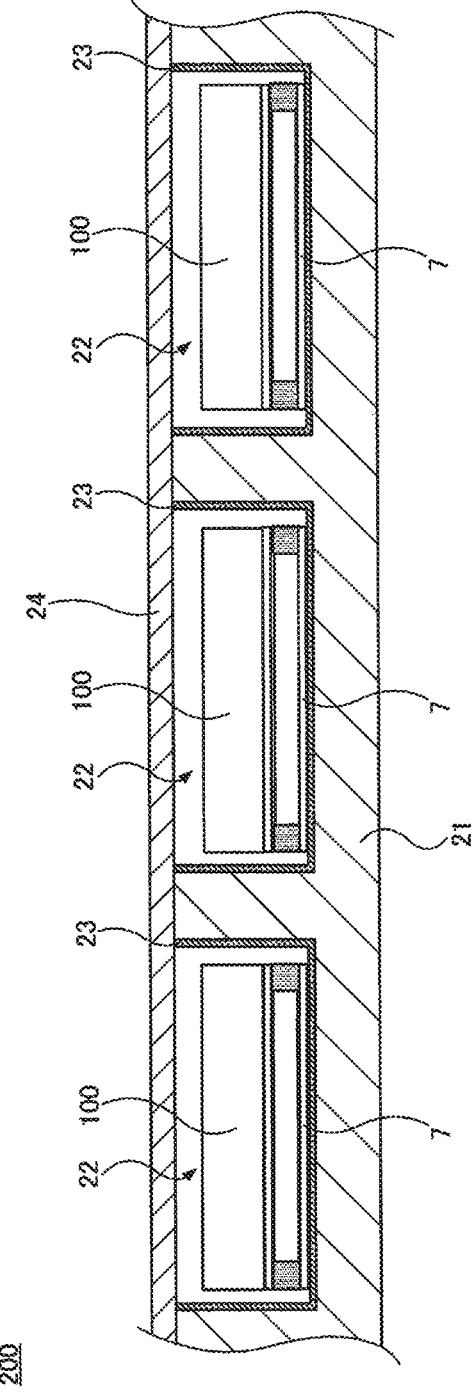
FIG. 6 is a diagram for describing an electronic component array 200 according to a preferred embodiment of the present invention.

FIG. 6 illustrates an electronic component array 200 according to the first preferred embodiment. The electronic component array is configured such that a plurality (a large number) of electronic components are conveyed, the configuration being applied when the plurality of electronic components are conveyed from a manufacturer of the electronic components or the like to an electronic device or an electric device manufacturer that is a user of the electronic components.

Electronic component array 200 includes a long carrier tape 21 with a uniform or substantially uniform thickness. Carrier tape 21 is made of any material, and, for example, resin or paper may be used. Carrier tape 21 preferably has flexibility.

A plurality of storage portions 22 having a hollow shape are provided in an upper principal surface of carrier tape 21. In electronic component array 200 according to the present preferred embodiment, an adhesion prevention layer 23 is provided on at least a portion of an inner surface (inner wall) of each storage portion 22.

Adhesion prevention layer 23 is provided to prevent first adhesive layer 7 of ceramic electronic component 100 with a carrier substrate from adhering to the inner wall of storage portion 22. Adhesion prevention layer 23 is made of any material, and, for example, a substance that is commercially available as a release agent may be used.

Ceramic electronic component 100 with a carrier substrate is stored in each storage portion 22 of electronic component array 200.

Each storage portion 22 that stores ceramic electronic component 100 with a carrier substrate is sealed with a long sealing tape 24. Sealing tape 24 is also made of any material, and, for example, resin or paper may be used. Sealing tape 24 also preferably has flexibility.

Since electronic component array 200 includes adhesion prevention layer 23 provided on at least a portion of the inner surface (inner wall) of each storage portion 22, electronic component array 200 is suitable for conveyance of ceramic electronic components 100 with a carrier substrate each including first adhesive layer 7 exposed on the outer surface. Electronic component array 200 can be conveyed with electronic component array 200 wound to be compact.

Mounting Structure of Ceramic Electronic Component

A mounting structure of (a process of mounting) multilayer ceramic capacitor 1 of ceramic electronic component 100 with a carrier substrate described above will be described with reference to FIGS. 7A to 7D.

Figure 7A:
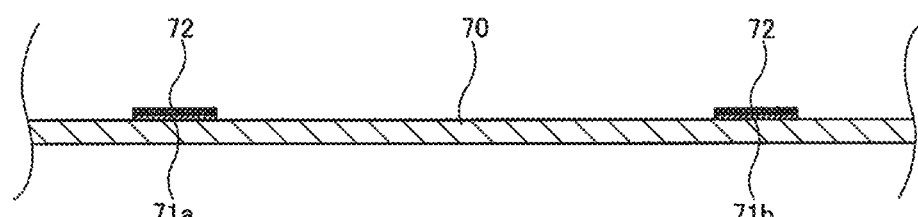
FIGS. 7A to 7D are diagrams for describing a mounting structure of (process of mounting) a multilayer ceramic capacitor 1 according to a preferred embodiment of the present invention.

First, as illustrated in FIG. 7A, a board 70 is prepared. Mounting electrodes 71*a*, 71*b* are provided on an upper principal surface of the board. Cream solder 72 is printed in advance on principal surfaces of mounting electrodes 71*a*, 71*b*.

Figure 7B:
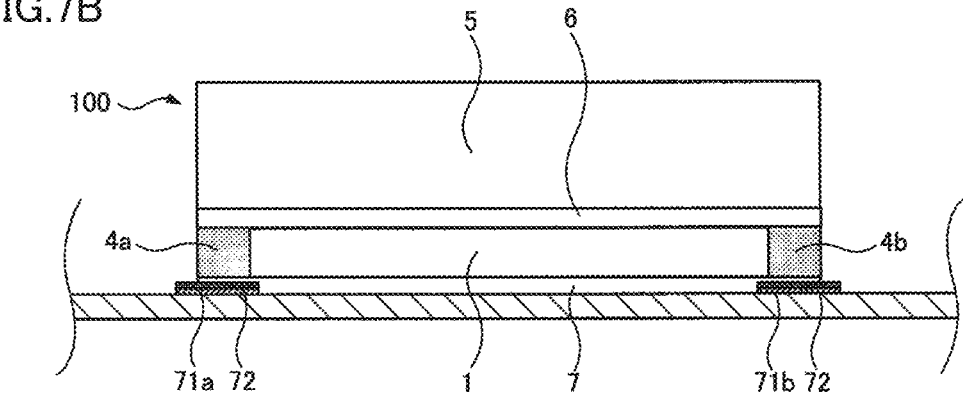

Next, as illustrated in FIG. 7B, ceramic electronic component 100 with a carrier substrate is temporarily attached to board 70 by first adhesive layer 7. At this time, most of first adhesive layer 7 is directly attached to the principal surface of board 70, but a portion of first adhesive layer 7 is attached to cream solder 72 printed on mounting electrodes 71*a*, 71*b*.

Figure 7C:

Next, as illustrated in FIG. 7C, carrier substrate 5 and second adhesive layer 6 are removed from multilayer ceramic capacitor 1 and discarded. As described above, with first adhesive layer 7 having a larger adhesive force than second adhesive layer 6, carrier substrate 5 is raised in a direction away from board 70, thus causing carrier substrate 5 and second adhesive layer 6 to separate from multilayer ceramic capacitor 1. All or a portion of second adhesive layer 6 may remain on second principal surface 1B of multilayer ceramic capacitor 1.

Figure 7D:
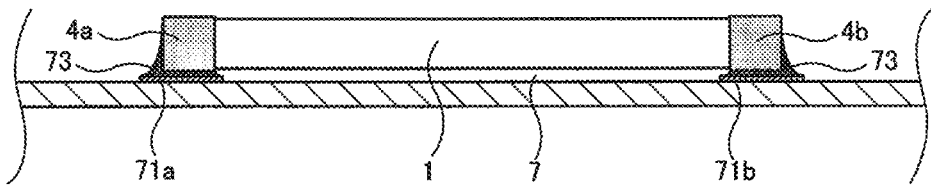

Next, as illustrated in FIG. 7D, cream solder 72 is heated to melt and then cooled to form a solder fillet 73. External electrode 4*a* and external electrode 4*b* of multilayer ceramic capacitor 1 are bonded to mounting electrode 71*a* and mounting electrode 71*b*, respectively, by solder fillet 73. First adhesive layer 7 between cream solder 72 and external electrodes 4*a*, 4*b* vaporizes or/and melts into solder fillet 73, for example. Further, first adhesive layer 7 between the principal surface of board 70 and multilayer ceramic capacitor 1 may also vaporize or the like.

As a result, multilayer ceramic capacitor 1 is mounted on board 70.

Second Preferred Embodiment

Ceramic Electronic Component with Carrier Substrate

Figures 8A, 8B:
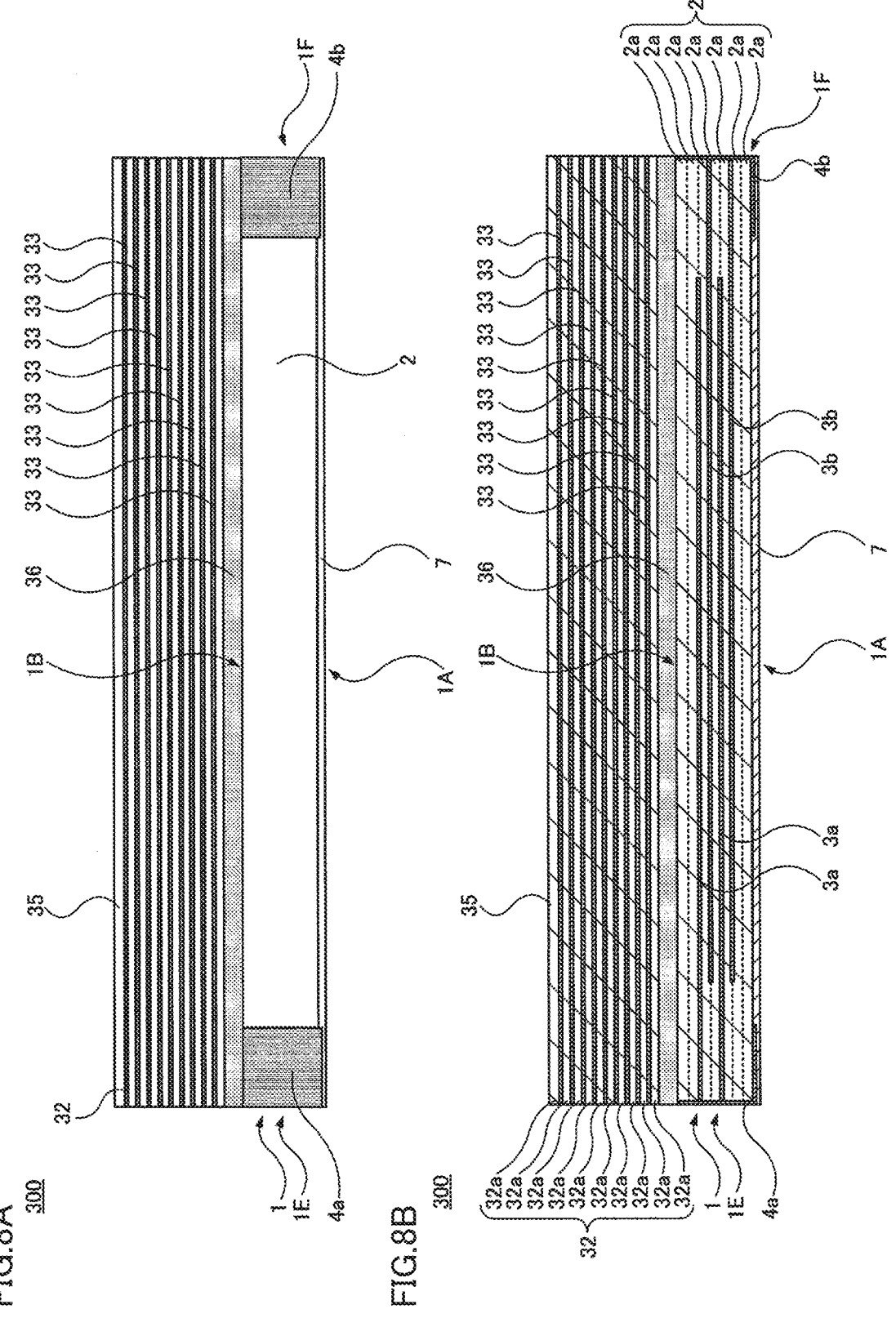
FIG. 8A is a side view of a ceramic electronic component 300 with a carrier substrate according to a preferred embodiment of the present invention.
FIG. 8B is a cross-sectional view of ceramic electronic component 300 with a carrier substrate according to a preferred embodiment of the present invention.

FIGS. 8A and 8B illustrate a ceramic electronic component 300 with a carrier substrate according to a second preferred embodiment of the present invention. FIG. 8A is a side view of ceramic electronic component 300 with a carrier substrate. FIG. 8B is a cross-sectional view of ceramic electronic component 300 with a carrier substrate.

Ceramic electronic component 300 with a carrier substrate corresponds to a ceramic electronic component obtained by changing a portion of the configuration of ceramic electronic component 100 with a carrier substrate according to the first preferred embodiment described above.

Ceramic electronic component 100 with a carrier substrate has a configuration in which carrier substrate 5 is made of, for example, resin, but ceramic electronic component 300 with a carrier substrate has a different configuration in which a carrier substrate 35 is made of, for example, ceramics. Further, ceramic electronic component 100 with a carrier substrate has a configuration in which multilayer ceramic capacitor 1 and carrier substrate 5 are attached to each other by second adhesive layer 6 provided between multilayer ceramic capacitor 1 and carrier substrate 5, but ceramic electronic component 300 with a carrier substrate has a different configuration in which multilayer ceramic capacitor 1 and carrier substrate 35 are attached to each other by a brittle layer 36 provided between multilayer ceramic capacitor 1 and carrier substrate 35.

Carrier substrate 35 includes a ceramic body 32, ceramic body 32 including a laminate of a plurality of ceramic layers 32*a*. According to the present preferred embodiment, ceramic layers 32*a* is made of, for example, dielectric ceramics having the same composition as ceramic body 2 (ceramic layers 2*a*) of multilayer ceramic capacitor 1. Ceramic layers 32*a* is made of ceramics different in composition from ceramic body 2.

A dummy electrode 33 is provided between ceramic layers 32*a*. In the present application, dummy electrode 33 may be referred to as a metal layer. According to the present preferred embodiment, as will be described later, ceramic body 32 of carrier substrate 35 and ceramic body 2 of multilayer ceramic capacitor 1 are simultaneously fired with ceramic body 32 and ceramic body 2 attached to each other, and dummy electrode 33 plays a role in causing ceramic body 32 and ceramic body 2 to resemble each other in behavior (shrinkage or the like) during firing. Dummy electrode 33 includes no electrical role.

As illustrated in FIGS. 8A and 8B, according to the present preferred embodiment, dummy electrode 33 is exposed from the side surface and the end surface of carrier substrate 35. In a case where dummy electrode 33 is exposed from the side surface and the end surface of carrier substrate 35, it is easy to manufacture carrier substrate 35. That is, in general, the process of manufacturing carrier substrate 35 includes, for example, a process of making an unfired mother multilayer body and cutting the unfired mother multilayer body into separate unfired multilayer bodies. In a case where dummy electrode 33 is designed so as to be smaller in width and length than carrier substrate 35 and so as to be exposed from neither the side surface nor the end surface of carrier substrate 35, it is extremely difficult to control a cutting position when cutting the unfired mother multilayer body into separate unfired multilayer bodies, resulting in complicated work. That is, if the cutting position is wrong, dummy electrode 33 is exposed from the side surface or the end surface of carrier substrate 35, and thus, a defective product including dummy electrode 33 exposed from the side surface or the end surface is mixed with good products each including dummy electrode 33 exposed from neither of the side surface nor the end surface, leading to variations in quality. On the other hand, if dummy electrode 33 is designed so as to have the same or substantially the same width and length as carrier substrate 35 to be exposed from the side surface and the end surface of carrier substrate 35, it is not necessary to strictly control the cutting position when cutting the unfired mother multilayer body into separate unfired multilayer bodies, enabling carrier substrate 35 to be easily manufactured. Further, if dummy electrode 33 is designed to be exposed from the side surface and the end surface of carrier substrate 35, a problem that a step is generated between a portion where dummy electrode 33 is present and a portion where dummy electrode 33 is not present does not occur.

According to the present preferred embodiment, brittle layer 36 is also made of, for example, ceramics. Ceramic body 2 of multilayer ceramic capacitor 1 and ceramic body 32 of carrier substrate 35 are simultaneously fired to make brittle layer 36. Brittle layer 36 is made of ceramics more brittle than ceramic body 2 of multilayer ceramic capacitor 1 and ceramic body 32 of carrier substrate 35.

Several methods are conceivable for making ceramics of brittle layer 36 more brittle than ceramic body 2 of multilayer ceramic capacitor 1 and ceramic body 32 of the carrier substrate 35.

For example, ceramics higher in sintering temperature than the dielectric ceramics of ceramic body 2 and ceramic body 32 may be used as the ceramics constituting brittle layer 36. Then, the ceramics of ceramic body 2 and ceramic body 32 may be fired at a temperature lower than the sintering temperature of the ceramics constituting brittle layer 36. In this case, the ceramics of brittle layer 36 are unsintered and become more brittle than ceramic body 2 and ceramic body 32.

Alternatively, even in a case where ceramics having the same composition as the ceramics (dielectric ceramics) of ceramic body 2 and ceramic body 32 are used as the ceramics of brittle layer 36, an increase in porosity of the ceramics of brittle layer 36 can make the ceramics of brittle layer 36 more brittle than the ceramics of ceramic body 2 and ceramic body 32. In order to increase the porosity of the ceramics of brittle layer 36, for example, powder that disappears during firing may be added to a ceramic green sheet used for making brittle layer 36.

In ceramic electronic component 300 with a carrier substrate, first adhesive layer 7 between multilayer ceramic capacitor 1 and a board or the like preferably has a larger adhesive force than brittle layer 36 between multilayer ceramic capacitor 1 and carrier substrate 35.

For example, it is preferable to perform design as follows. First, a test substrate (not illustrated) that is made of the same material as carrier substrate 35 and includes an attachment surface identical in surface roughness to a surface of carrier substrate 35 that is not in contact with brittle layer 36 is made. Next, ceramic electronic component 300 with a carrier substrate is prepared, and first adhesive layer 7 is attached to the attachment surface of the test substrate. Next, a force is applied to the test substrate and carrier substrate 35 in a direction to cause the test substrate and carrier substrate 35 to separate from each other. The applied force is gradually increased. Multilayer ceramic capacitor 1 and carrier substrate 35 are designed so as to separate from each other earlier than multilayer ceramic capacitor 1 and the test substrate accordingly. That is, first adhesive layer 7 is designed so as to have a larger adhesive force than brittle layer 36.

When ceramic electronic component 300 with a carrier substrate is attracted by, for example, a nozzle of a mounter device, carrier substrate 35 can be used as an attraction portion, thus making ceramic electronic component 300 with a carrier substrate less susceptible to a crack or the like in ceramic body 2 of multilayer ceramic capacitor 1 (ceramic electronic component).

When ceramic electronic component 300 with a carrier substrate is mounted on a board or the like, first adhesive layer 7 can be used for temporary attachment.

As can be seen from FIGS. 8A and 8B, according to the present preferred embodiment, dummy electrode 33 is exposed from both the side surface and the end surface of carrier substrate 35. A design modification may be made so as to cause dummy electrode 33 to be exposed from only one of the side surface or the end surface of carrier substrate 35 or to prevent dummy electrode 33 from being exposed from the side surface and the end surface.

Example of Method for Manufacturing Ceramic Electronic Component with Carrier Substrate Ceramic electronic component 300 with a carrier substrate can be manufactured, for example, by the method illustrated in FIGS. 9A to 9D.

Figures 9A, 9B, 9C, 9D:
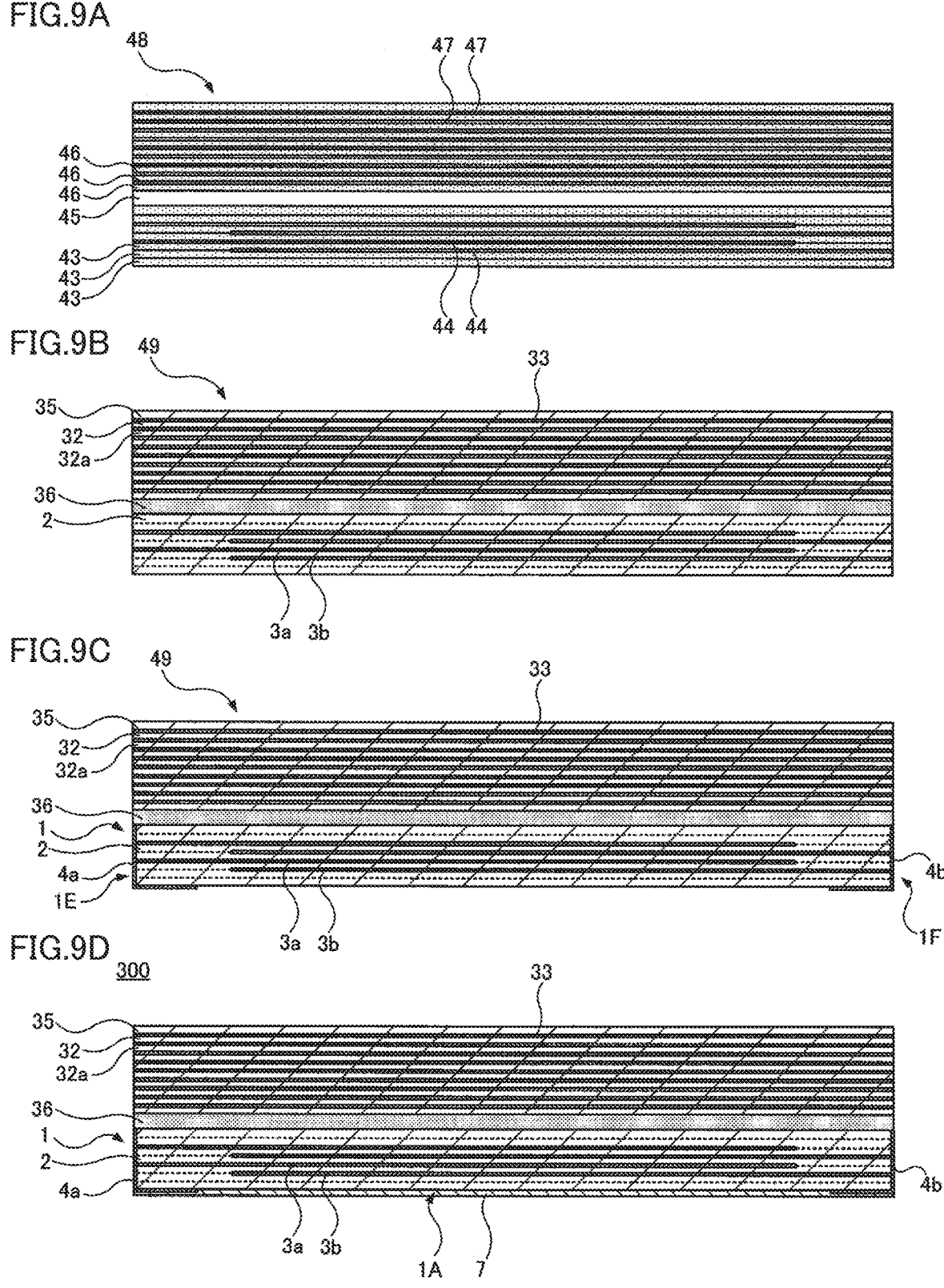
FIGS. 9A to 9D are diagrams for describing respective processes of an example of a method for manufacturing ceramic electronic component 300 with a carrier substrate according to a preferred embodiment of the present invention.

First, as illustrated in FIG. 9A, a predetermined number of ceramic green sheets 43 used for making ceramic body 2 of multilayer ceramic capacitor 1 are laminated. A conductive paste 44 used for making internal electrodes 3a, 3b is printed on a principal surface of a predetermined ceramic green sheet 43. A ceramic green sheet 45 used for making brittle layer 36 is laminated on ceramic green sheets 43. The thickness and the number of ceramic green sheets 45 are freely determined. A predetermined number of ceramic green sheets 46 used for making ceramic body 32 of carrier substrate 35 are laminated on ceramic green sheet 45. A conductive paste 47 used for making dummy electrode 33 is printed on a principal surface of predetermined ceramic green sheet 46. Next, all the elements are pressed in the vertical direction into a single body to make an unfired multilayer body 48.

Next, as illustrated in FIG. 9B, unfired multilayer body 48 is fired to make a multilayer body 49 in which ceramic body 2 of multilayer ceramic capacitor 1 and ceramic body 32 of carrier substrate 35 are attached to each other with brittle layer 36 interposed between ceramic body 2 and ceramic body 32.

Next, as illustrated in FIG. 9C, external electrode 4a is provided on first end surface 1E of ceramic body 2 of multilayer ceramic capacitor 1, and external electrode 4b is provided on second end surface 1F.

Next, as illustrated in FIG. 9D, first adhesive layer 7 is provided on first principal surface 1A of ceramic body 2 of multilayer ceramic capacitor 1.

As a result, ceramic electronic component 300 with a carrier substrate is completed.

Third Preferred Embodiment

Ceramic Electronic Component with Carrier Substrate

Figures 10A, 10B:
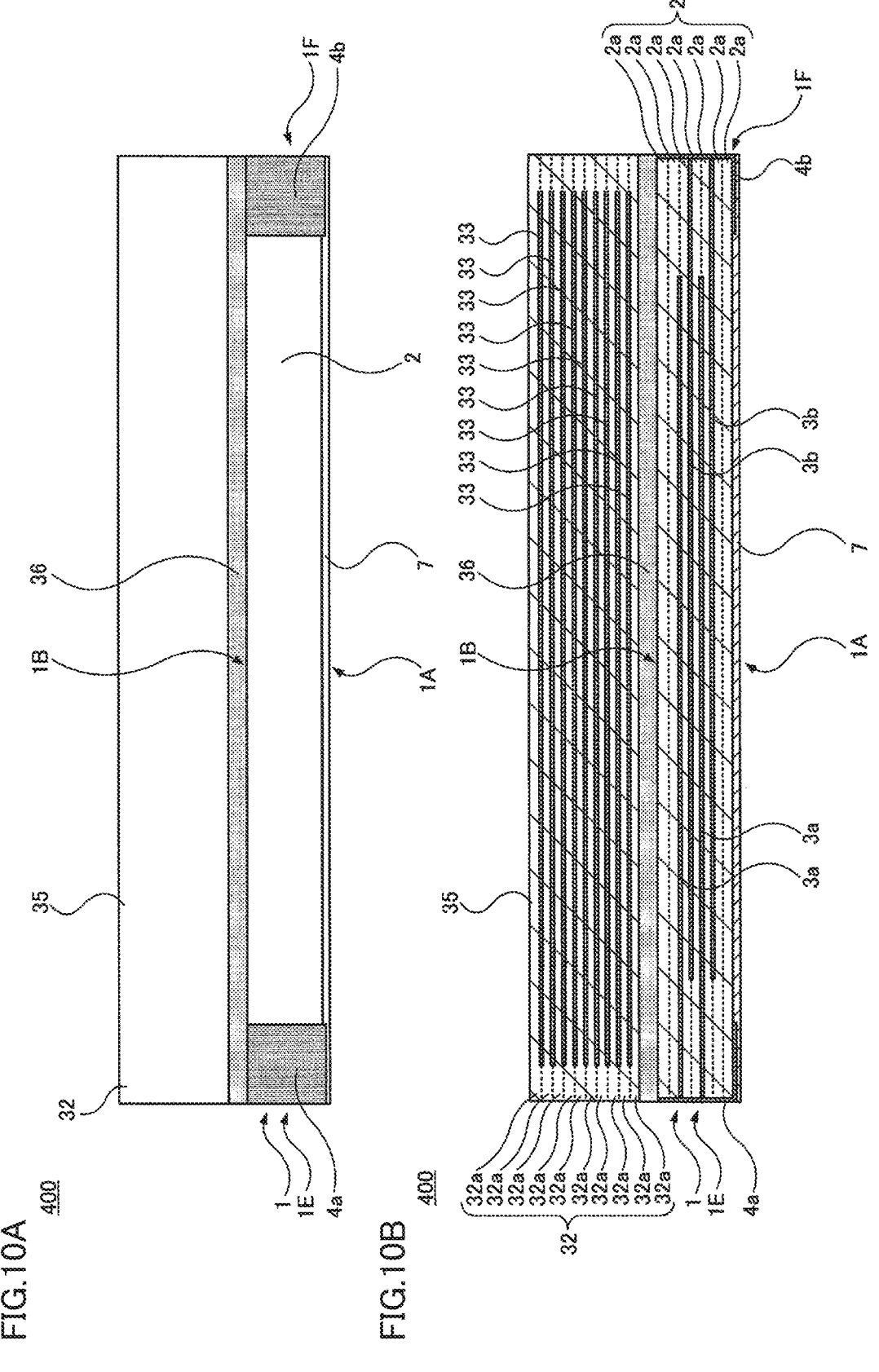
FIG. 10A is a side view of a ceramic electronic component 400 with a carrier substrate according to a preferred embodiment of the present invention.
FIG. 10B is a cross-sectional view of ceramic electronic component 400 with a carrier substrate according to a preferred embodiment of the present invention.

FIGS. 10A and 10B illustrate a ceramic electronic component 400 with a carrier substrate according to a third preferred embodiment of the present invention. FIG. 10A is a side view of ceramic electronic component 400 with a carrier substrate. FIG. 10B is a cross-sectional view of ceramic electronic component 400 with a carrier substrate.

Ceramic electronic component 400 with a carrier substrate corresponds to a ceramic electronic component obtained by changing a portion of the configuration of ceramic electronic component 300 with a carrier substrate according to the second preferred embodiment described above. Specifically, ceramic electronic component 300 includes dummy electrode 33 exposed from the side surface and the end surface of carrier substrate 35. For ceramic electronic component 400, a modification is made so as to make dummy electrode 33 smaller in width and length than carrier substrate 35 to prevent dummy electrode 33 from being exposed from the side surface and the end surface of carrier substrate 35.

Since ceramic electronic component 400 with a carrier substrate includes dummy electrode 33 exposed from neither the side surface nor the end surface of carrier substrate 35, unnecessary electrical short circuit via exposed dummy electrode 33 is prevented from occurring.

The ceramic electronic component with a carrier substrate, the mounting structure of the ceramic electronic component, and the electronic component array according to the preferred embodiments have been described above. The present invention, however, is not limited to the above-described preferred embodiments, and various modifications may be made in accordance with the gist of the present invention.

For example, ceramic electronic components 100, 300, 400 with a carrier substrate each include multilayer ceramic capacitor 1 as a ceramic electronic component, but the ceramic electronic component may be any type and is not limited to a multilayer ceramic capacitor. For example, the ceramic electronic component may be an inductor, a thermistor, a varistor, a resistor, or the like other than a capacitor.

Further, the ceramic electronic component is not limited to a multilayer ceramic electronic component, and may be a bulk ceramic electronic component.

In ceramic electronic components 100, 300, 400 with a carrier substrate, the ceramic electronic component (multilayer ceramic capacitor 1) includes two external electrodes 4a, 4b, but the number of external electrodes may be greater than or equal to three.

Further, in ceramic electronic components 100, 300, 400 with a carrier substrate, multilayer ceramic capacitor 1 and carrier substrates 5, 35 are identical or substantially identical in shape and size to each other when viewed from above, but may be different shapes and/or sizes from each other.

Further, in ceramic electronic components 300, 400 with a carrier substrate, dummy electrode (metal layer) 33 is provided between ceramic layers 32a of carrier substrate 35, but dummy electrode 33 need not be provided.

A ceramic electronic component with a carrier substrate according to a preferred embodiment of the present invention includes a ceramic electronic component including a first principal surface and a second principal surface, a first end surface and a second end surface, and a first side surface and a second side surface, and at least two external electrodes provided on an outer surface of the ceramic electronic component, and a carrier substrate attached to the second principal surface of the ceramic electronic component, wherein a first adhesive layer is provided on the first principal surface of the ceramic electronic component.

In the ceramic electronic component with a carrier substrate, it is preferable that the second principal surface of the ceramic electronic component and the carrier substrate be attached to each other by a second adhesive layer provided between the second principal surface and the carrier substrate.

In this case, a test substrate is prepared, the test substrate being made of a material identical or substantially identical to a material of the carrier substrate and including an attachment surface having the same or substantially the same surface roughness as a surface of the carrier substrate to which the ceramic electronic component is attached, and when a force is applied to the test substrate and the carrier substrate in a direction to cause the test substrate and the carrier substrate to separate from each other with the first adhesive layer attached to the attachment surface of the test substrate, it is further preferable that the ceramic electronic component and the carrier substrate separate from each other earlier than the ceramic electronic component and the test substrate. It is further preferable that the first adhesive layer has a larger adhesive force than the second adhesive layer.

It is further preferable that the carrier substrate is made of resin.

It is further preferable that the second principal surface of the ceramic electronic component and the carrier substrate are attached to each other with a brittle layer interposed between the second principal surface and the carrier substrate, the brittle layer being more brittle than a ceramic body of the ceramic electronic component and more brittle than the carrier substrate.

In this case, a test substrate is prepared, the test substrate being made of a material identical or substantially identical to a material of the carrier substrate and including an attachment surface having the same or substantially the same surface roughness as a surface of the carrier substrate to which the ceramic electronic component is not attached, and when a force is applied to the test substrate and the carrier substrate in a direction to cause the test substrate and the carrier substrate to separate from each other with the first adhesive layer attached to the attachment surface of the test substrate, it is further preferable that the ceramic electronic component and the carrier substrate separate from each other earlier than the ceramic electronic component and the test substrate.

It is further preferable that the carrier substrate is made of ceramics. This allows the ceramic body of the ceramic electronic component and the ceramic body of the carrier substrate to be made by simultaneous firing and thus increases the productivity of the ceramic electronic component with a carrier substrate.

It is further preferable that the carrier substrate is provided in a multilayer structure in which a plurality of ceramic layers are laminated, and a metal layer (dummy electrode) is provided between at least one pair of the ceramic layers. This allows, in a case where the ceramic body of the ceramic electronic component and the ceramic body of the ceramic-made carrier substrate are made by simultaneous firing, both of the ceramic bodies to be adjusted to resemble each other in behavior (shrinkage or the like) during firing.

The metal layer may be exposed from the side surface or the end surface of the carrier substrate, or need not be exposed from either the side surface or the end surface of the carrier substrate. In a case where the metal layer is exposed from the side surface or the end surface of the carrier substrate, it is not necessary to strictly control a cutting position when cutting an unfired mother multilayer body into separate unfired multilayer bodies, so that the carrier substrate can be easily manufactured. This further avoids a problem that a step is generated between a portion where the metal layer is present and a portion where the metal layer is not present. On the other hand, in a case where the metal layer is exposed from neither the side surface nor the end surface of the carrier substrate, unnecessary electrical short circuit via an exposed metal layer is prevented from occurring.

It is further preferable that the carrier substrate and the ceramic electronic component are made of ceramics identical or substantially identical in composition. This eliminates the need to prepare separate materials and thus increases the productivity of the ceramic electronic component with a carrier substrate.

It is further preferable that the brittle layer is made of ceramics. This allows the ceramic body of the ceramic electronic component, the ceramic body of the ceramic-made carrier substrate, and the brittle layer to be made by simultaneous firing and thus increases the productivity of the ceramic electronic component with a carrier substrate.

It is further preferable that the external electrode is provided on at least the first principal surface, and the first adhesive layer is provided on the first principal surface where the external electrodes are not provided. This makes it possible to prevent the first adhesive layer from interfering with bonding of the external electrodes. Alternatively, it is further preferable that the first adhesive layer is provided over the entire or substantially the entire first principal surface. This allows an increase in the adhesive force of the first adhesive layer.

It is further preferable that the ceramic electronic component is a multilayer ceramic electronic component in which a plurality of ceramic layers and a plurality of internal electrodes are laminated.

It is further preferable that a mounting structure of a ceramic electronic component is provided, the mounting structure including a board, and a ceramic electronic component with a carrier substrate according to a preferred embodiment of the present invention, in which the ceramic electronic component with a carrier substrate is attached to a principal surface of the board by the first adhesive layer. This allows the carrier substrate to be easily removed from the ceramic electronic component and discarded or the like.

It is further preferable that an electronic component array is provided, the electronic component array including a long tape including a plurality of storage portions provided in one principal surface, at least one ceramic electronic component with a carrier substrate according to a preferred embodiment of the present invention, in which an adhesion prevention layer is provided on at least a portion of an inner surface of each of the storage portions to prevent the first adhesive layer from adhering to the portion of the inner surface of each of the storage portions, and the ceramic electronic component with a carrier substrate is stored in each of the storage portions. This allows the ceramic electronic component with a carrier substrate according to a preferred embodiment of the present invention to be conveyed satisfactorily.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
a ceramic electronic component including a first principal surface and a second principal surface, a first end surface and a second end surface, a first side surface and a second side surface, and at least two external electrodes on an outer surface of the ceramic electronic component; and
a carrier substrate attached to the second principal surface of the ceramic electronic component; wherein
a first adhesive layer is on the first principal surface of the ceramic electronic component;
the second principal surface of the ceramic electronic component and the carrier substrate are attached to each other by a second adhesive layer between the second principal surface and the carrier substrate, the second adhesive layer is in contact with the carrier substrate, and the second adhesive layer is in contact with only the second principal surface of the ceramic electronic component;
the ceramic electronic component and the second adhesive layer are identical or substantially identical in shape to each other when viewed from above; and

the ceramic electronic component and the carrier substrate are identical or substantially identical in shape to each other when viewed from above.

2. The ceramic electronic component according to claim 1, wherein the first adhesive layer has a larger adhesive force than the second adhesive layer.

3. The ceramic electronic component according to claim 1, wherein the carrier substrate is made of resin.

4. The ceramic electronic component according to claim 1, wherein
the external electrodes are on at least the first principal surface; and
the first adhesive layer is on the first principal surface at a location at which the external electrodes are not provided.

5. The ceramic electronic component according to claim 1, wherein the first adhesive layer is provided on an entirety or substantially an entirety of the first principal surface.

6. The ceramic electronic component according to claim 1, wherein the ceramic electronic component is a multilayer ceramic electronic component including a plurality of ceramic layers and a plurality of internal electrodes are laminated.

7. A mounting structure of a ceramic electronic component, the mounting structure comprising:
a board; and
the ceramic electronic component according to claim 1; wherein
the ceramic electronic component is attached to a principal surface of the board by the first adhesive layer.

8. The mounting structure according to claim 7, wherein the first adhesive layer has a larger adhesive force than the second adhesive layer.

9. An electronic component array comprising:
an elongated tape including a plurality of storage portions in one principal surface thereof; and
at least one ceramic electronic component according to claim 1; wherein
an adhesion prevention layer is on at least a portion of an inner surface of each of the storage portions to prevent the first adhesive layer from adhering to the portion of the inner surface of each of the storage portions; and
the ceramic electronic component with a carrier substrate is stored in each of the plurality of storage portions.

10. The electronic component array according to claim 9, wherein the first adhesive layer has a larger adhesive force than the second adhesive layer.

* * * * *